United States Patent
Gill et al.

(10) Patent No.: US 7,820,455 B2
(45) Date of Patent: Oct. 26, 2010

(54) METHOD FOR MANUFACTURING A TUNNEL JUNCTION MAGNETORESISTIVE SENSOR WITH IMPROVED PERFORMANCE AND HAVING A COFEB FREE LAYER

(75) Inventors: Hardayal Singh Gill, Palo Alto, CA (US); Wipul Pemsiri Jayasekara, Los Gatos, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 211 days.

(21) Appl. No.: 12/060,006

(22) Filed: Mar. 31, 2008

(65) Prior Publication Data
US 2009/0246890 A1    Oct. 1, 2009

(51) Int. Cl.
*H01L 21/00* (2006.01)
(52) U.S. Cl. .................. 438/3; 438/238; 438/381; 257/295; 257/421; 257/E21.665; 257/E43.004
(58) Field of Classification Search ........ 438/3, 438/238, 381; 257/2–5, 295, 421–425; 360/324–324.2; 428/822.3–822.5
See application file for complete search history.

(56) References Cited

U.S. PATENT DOCUMENTS

| 7,235,408 | B2 | 6/2007 | Janesky et al. | 438/3 |
| 7,595,520 | B2 * | 9/2009 | Horng et al. | 257/295 |
| 2007/0015293 | A1 | 1/2007 | Wang et al. | 438/3 |
| 2007/0253120 | A1 | 11/2007 | Saito et al. | 360/324.11 |

* cited by examiner

*Primary Examiner*—Dung A. Le
(74) *Attorney, Agent, or Firm*—Zilka-Kotab, PC

(57) ABSTRACT

A method for manufacturing a magnetoresistive sensor that provides increased magnetoresistive performance. The method includes forming a series of sensor layers with at least one layer containing CoFeB, and having a first capping layer thereover. A high temperature annealing is performed to optimize the grains structure of the sensor layers. The first capping layer is then removed, such as by reactive ion etching (RIE). An antiferromagnetic layer is then deposited followed by a second capping layer. A second annealing is performed to set the magnetization of the pinned layer, the second annealing being performed at a lower temperature than the first annealing.

11 Claims, 11 Drawing Sheets

METHOD FOR MANUFACTURING A TUNNEL JUNCTION MAGNETORESISTIVE SENSOR WITH IMPROVED PERFORMANCE AND HAVING A COFEB FREE LAYER

FIELD OF THE INVENTION

The present invention relates to magnetoresistive sensors and more particularly to a sensor constructed by a method that allows the sensor to achieve high TMR values using a CoFeB free layer.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

A magnetoresistive sensor referred to as a giant magnetoresistive (GMR) sensor has been employed for sensing magnetic fields from the rotating magnetic disk. The sensor includes a nonmagnetic conductive layer, referred to as a spacer layer, sandwiched between first and second ferromagnetic layers, referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

In the push to increase data density and sensor performance, researchers have sought to develop tunnel junction sensors (TMR sensor). These sensors operate based on the spin dependent tunneling of electrons through a thin, electrically insulating barrier layer. Such sensors have the potential to provide improved data density. However, even with the use of such TMR sensors, there is still an ever increasing need for improved data density. Therefore, there is a need for a sensor (either TMR or GMR) that can provide improved magnetic performance, resulting in improved data density in order to meet the needs of current and future data recording systems.

SUMMARY OF THE INVENTION

The present invention provides a method for manufacturing a magnetoresistive sensor that provides increased magnetoresistive performance. The method includes forming a series of sensor layers with at least one layer containing cobalt-iron-boron (CoFeB), and having a first capping layer thereover. A high temperature annealing is performed to optimize the grain structure of the sensor layers. The first capping layer is then removed, such as by reactive ion etching (RIE). An antiferromagnetic layer is then deposited followed by a second capping layer. A second annealing is performed to set the magnetization of the pinned layer, the second annealing being performed at a lower temperature than the first annealing.

The first annealing can be performed at a temperature of between 300 and 400 degrees Celsius, whereas the second annealing can be performed at a temperature of between 200 and 300 degrees Celsius.

After removing the first capping layer, a cleaning and refill process can be performed to ensure good exchange coupling with the AFM layer.

The first high temperature annealing optimizes the grain structure of the magnetic layers of the sensor. However, if an AFM layer, such as PtMn or IrMn were present during this high temperature annealing, Mn would migrate into the magnetic layers, thereby significantly reducing the performance of the sensor. Performing the first, high temperature annealing prior to the deposition of the AFM layer advantageously results in greatly improved magnetic performance.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
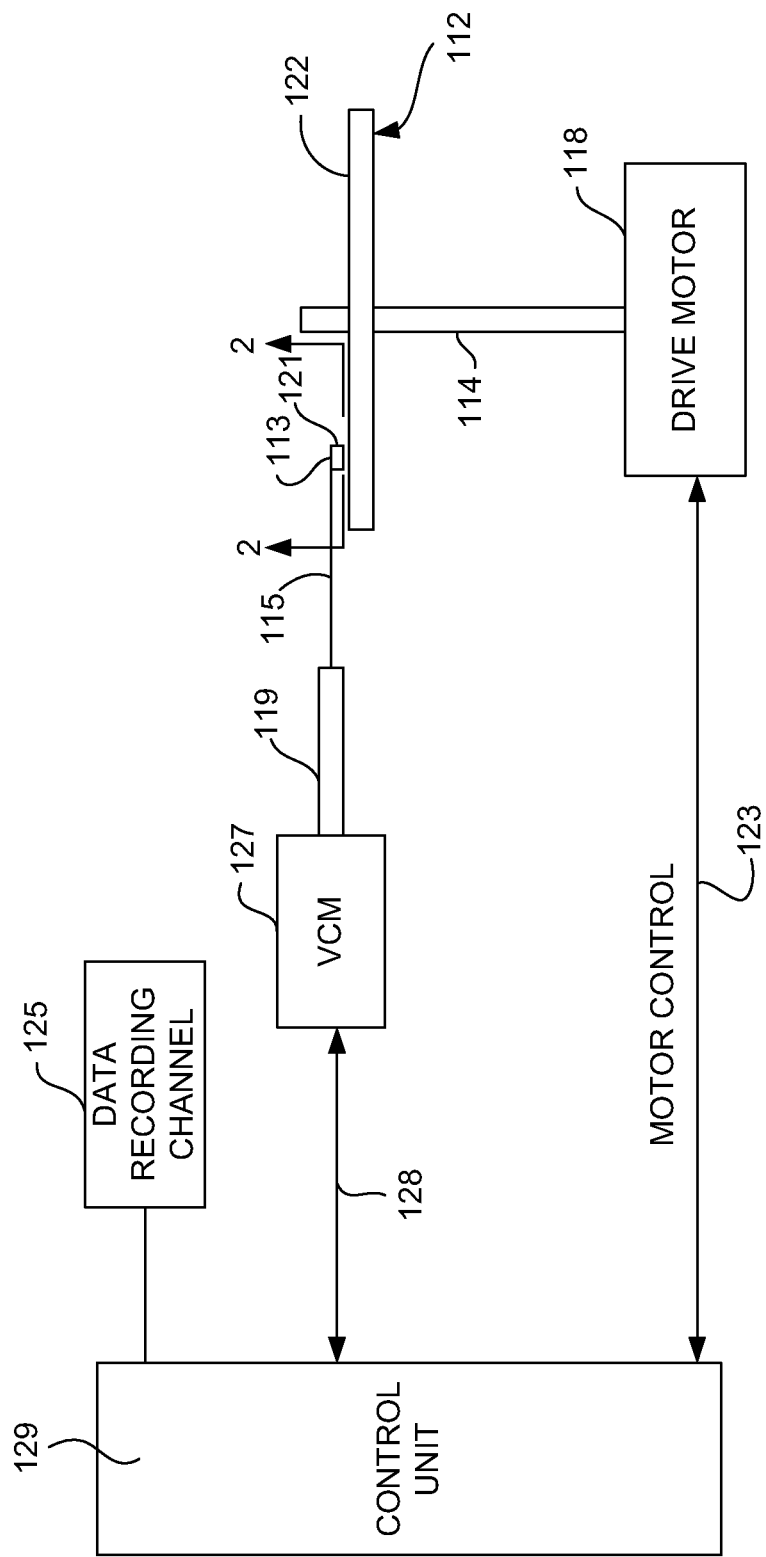
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
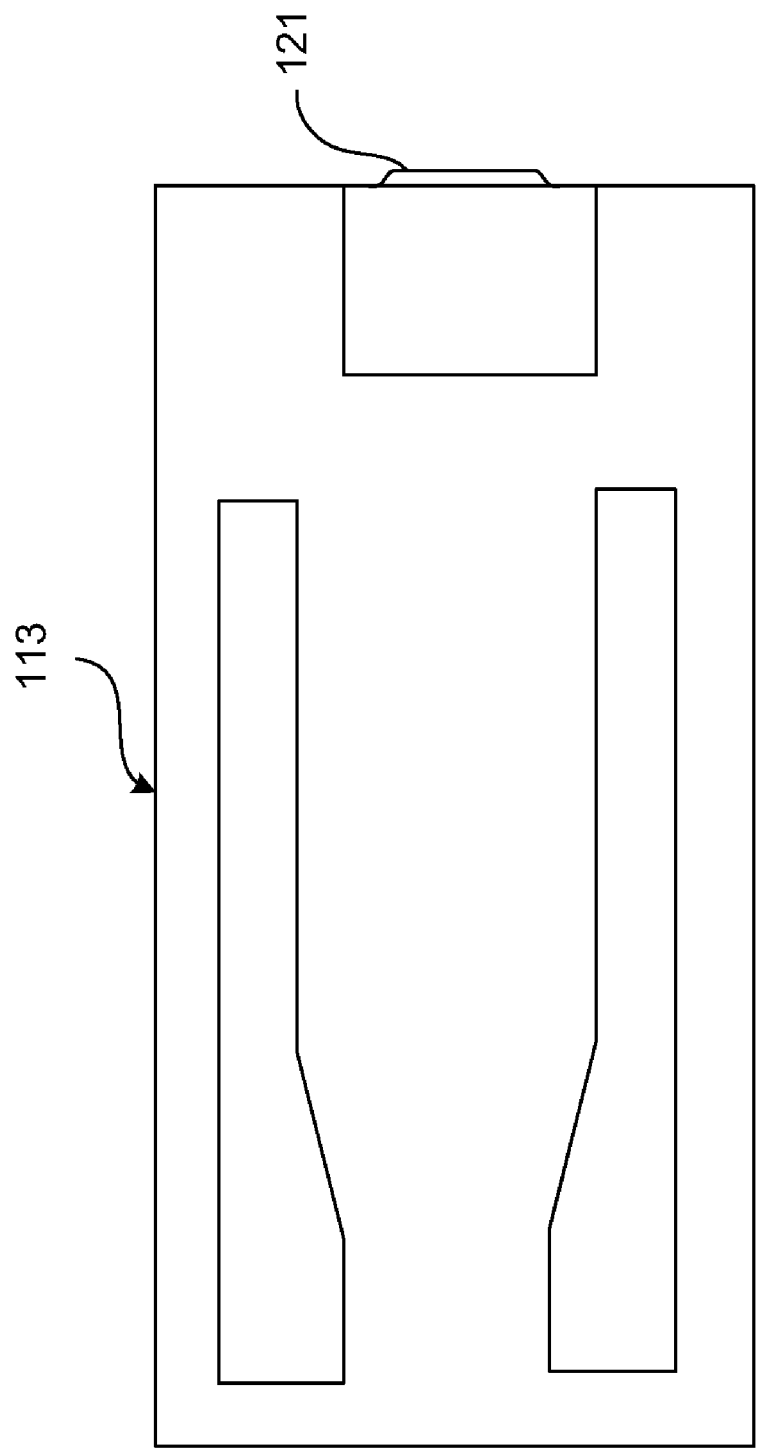
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
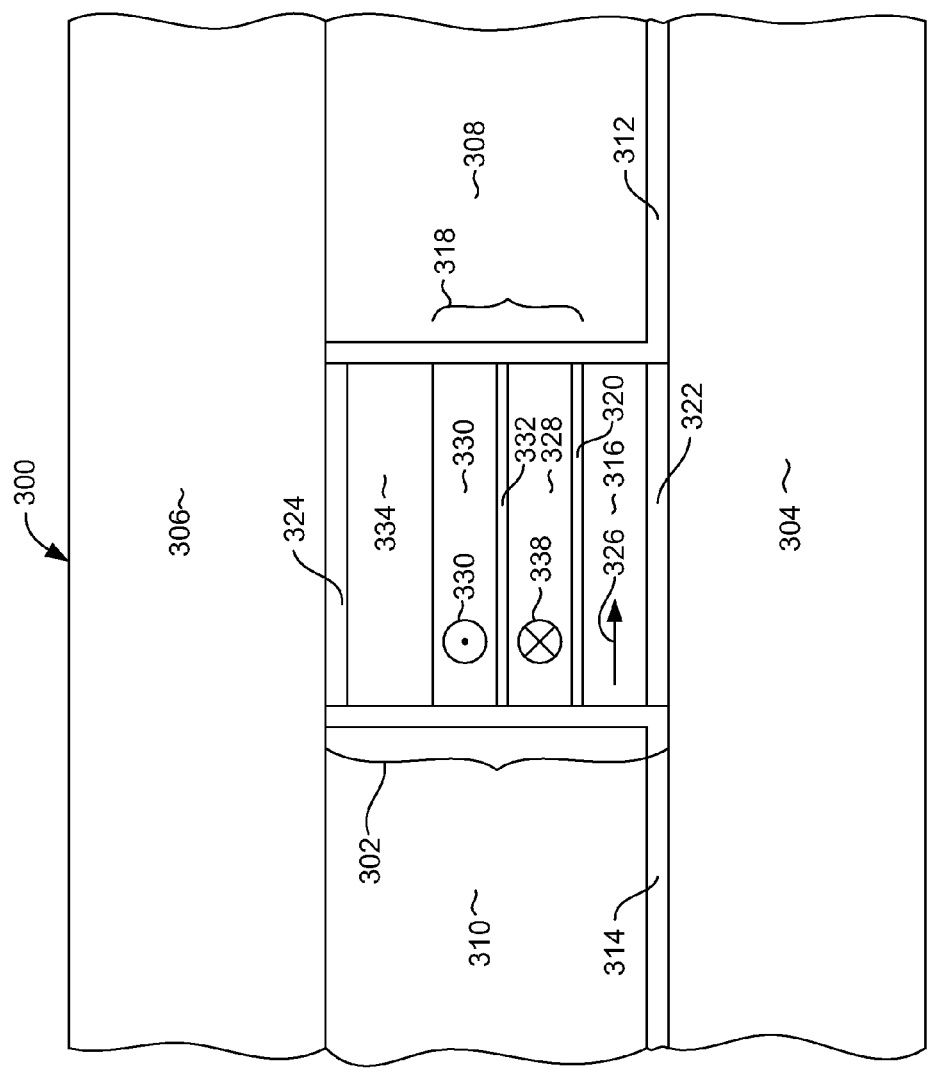
FIG. 3 is an enlarged ABS view of a magnetoresistive sensor of a magnetic head for use in disk drive system.

With reference now to FIG. 3, a magnetoresistive sensor 300 includes a sensor stack 302 sandwiched between first and second electrically conductive leads 304, 306. The upper lead 306 can be constructed of a magnetic material such as NiFe so that it can function as a magnetic shield as well as a lead. The bottom lead/shield 304 is preferably constructed of an electrically conductive, magnetic, high crystallization temperature material such as CoFeHfOx. The use of such a high crystallization temperature material is especially useful if the high temperature annealing (to be described in greater detail below) is to be performed at a temperature greater then 350 degrees Celsius. If an annealing temperature less than 350 degrees Celsius is used, then the bottom lead 304 can be simply a material such as NiFe. First and second hard magnetic bias layers can be formed at either side of the sensor stack 302 to provide free layer biasing as will be discussed below. The bias layers 308, 310 can be constructed of a hard magnetic material such as CoPt or CoPtCr. The hard bias layers 308, 310 can be separated from the sensor stack 302 and from the bottom lead 304 by thin insulating layers 312, 314, which can be constructed of conformally deposited alumina, for example.

With reference still to FIG. 3, the sensor stack includes a free layer structure 316, a pinned layer structure 318 and a non-magnetic, electrically insulating barrier layer 320 sandwiched between the free layer structure 316 and the pinned layer structure 318. A seed layer 322 is preferably provided at the bottom of the sensor stack 302 to promote a desired grain structure in other layers of the sensor stack 302. A capping layer 324 is provided at the top of the sensor stack 302 to protect the layers of the sensor stack 302 during manufacture. The function and formation of this capping layer 324 will be described in greater detail herein below With continued reference to FIG. 3, the free layer structure 316 is constructed of CoFeB, preferably having a B content greater than 15 atomic percent. The free layer 316 has a magnetization that is biased in a direction parallel with the air bearing surface as indicated by arrow 326. This biasing can be provided by a magnetic bias field from the hard bias layers 308, 310. As can be seen, the sensor stack 302 is configured so that the free layer structure 316 is below the pinned layer structure 318 (e.g. the free 316 is deposited before the pinned layer structure 318). The reason for this structure will become apparent below.

With reference still to FIG. 3, the pinned layer structure 318 includes first and second magnetic layers AP1 328 and AP2 330. The AP1 and AP2 layers 328, 330 are separated by a thin non-magnetic antiparallel coupling layer 332, which can be, for example, Ru having a thickness of around 4 Angstroms. The AP2 layer 330 is exchange coupled with a layer of antiferromagnetic material (AFM layer) 334. Exchange coupling with the AFM layer pins the magnetization of the AP2 layer in a direction perpendicular to the air bearing surface as indicated by arrow head symbol 330. Antiparallel coupling between the AP1 and AP2 layers pins the magnetization of the AP1 layer 328 in a direction perpendicular to the air bearing surface and antiparallel with the magnetization 336 as indicated by arrow tail 338.

The AP1 layer 328 (the magnetic layer closest to the free layer 316) is preferably constructed of CoFeB. The AP2 layer (the magnetic layer furthest from the free layer 316) is preferably constructed of CoFe, and preferably has an Fe content of 30-50 atomic percent or about 40 atomic percent. The AP2 layer 330 can be constructed so that it actually includes multiple layers of CoFe, as will be discussed further below with reference to a method for manufacturing a sensor according to an embodiment of the invention.

Figure 4:
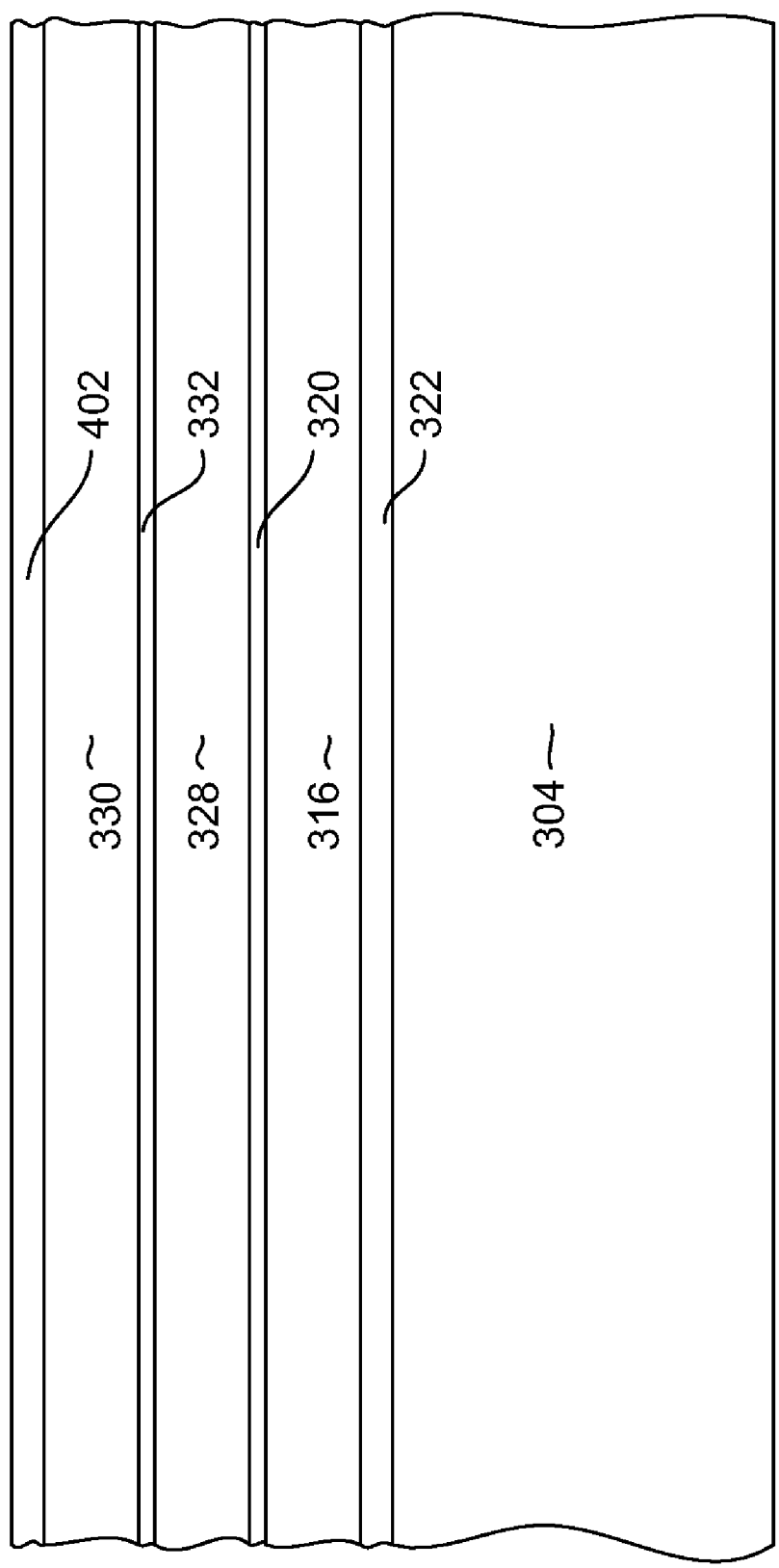
FIGS. 4-7 are views of a magnetoresistive sensor in various intermediate stages of manufacture, illustrating a method of manufacturing a sensor according to an embodiment of the invention.

With reference now to FIGS. 4-7 a method is described for constructing a magnetoresistive sensor according to an embodiment of the invention. With particular reference to FIG. 4, an electrically conductive, magnetic shield/lead layer 304 is formed on a wafer (not shown). The following layers are then deposited, preferably by sputter deposition or ion beam sputtering: a seed layer 322, deposited over the shield/lead 304; a magnetic free layer 316, deposited over the seed layer 322; a non-magnetic, electrically insulating barrier layer 320, deposited over the free layer 316; first magnetic pinned layer (AP1) 328, deposited over the barrier layer 320; an AP coupling layer 332, deposited over the AP1 layer 328; and a second magnetic pinned layer AP2 330 deposited over the AP coupling layer 332. A first capping layer 402, preferably constructed of Ta having a thickness of 20 to 40 Angstroms, is then deposited over the layers 304, 322, 316, 320, 328, 332, and 330.

The shield/lead layer can be constructed of NiFe, but is preferably a high crystallization temperature material such as CoFeHfOx. The first seed layer can be a material such as Ta, Ru, NiFe or Ru, or can be a combination of CoFe and NiFe with a thin layer of Ru at the top. The free layer is preferably deposited as a layer of CoFeB, but may include one or more layers of other materials such as a layer of CoFe interfacing the barrier layer. The barrier layer 320 is a thin, non-magnetic, electrically insulating material, and is preferably constructed of MgO. The AP1 layer 328 is preferably CoFeB, and the AP2 layer 330 is preferably CoFe with about 40 atomic percent Fe. The AP coupling layer 332 can be a thin layer of Ru, having a thickness of, for example, about 4 Angstroms.

After these layers 304, 322, 316, 320, 328, 332, 330, 402 have been deposited, and with the Ta capping layer 402 still in place, a first, high temperature annealing is performed. The high temperature annealing is performed at a temperature of 300 to 400 degrees Celsius, or at about 350 degrees Celsius. This high temperature annealing affects the grain structure free layer 316, barrier layer 320 and AP1 layer 328 in a way that greatly increases the TMR performance of the sensor. This high temperature annealing is preferably performed for a period of 5 to 7 hours in a magnetic field (for example greater than 30 KOe) oriented in a direction that is parallel to the air bearing surface of the head.

It should be pointed out that, while this high temperature annealing increases the TMR performance, if a layer of antiferromagnetic material, such as PtMn or IrMn, were included at this point and were subject to such a high temperature annealing, Mn would migrate into the other layers of the sensor and would, thereby, greatly decrease sensor performance. The present invention allows this high temperature annealing to be performed without such an antiferromagnetic layer being present. This will become clearer below.

After the high temperature annealing has been performed, the Ta capping layer 402 can be removed by a process such as reactive ion etching (RIE). This RIE can be performed, for example in a fluorine containing atmosphere, such as $CF_4$ or a combination of $CF_4$ and $CHF_3$. After performing the RIE to remove the Ta capping layer 402, a cleaning process can be performed to clean the surface of the remaining AP2 layer 330. This cleaning process can be a low power plasma treatment, such as in $Ar/H_2$ (3%). This cleaning process helps to ensure that there is no loss of magnetic moment in the AP2 layer 330 as a result of the RIE.

Figure 5:
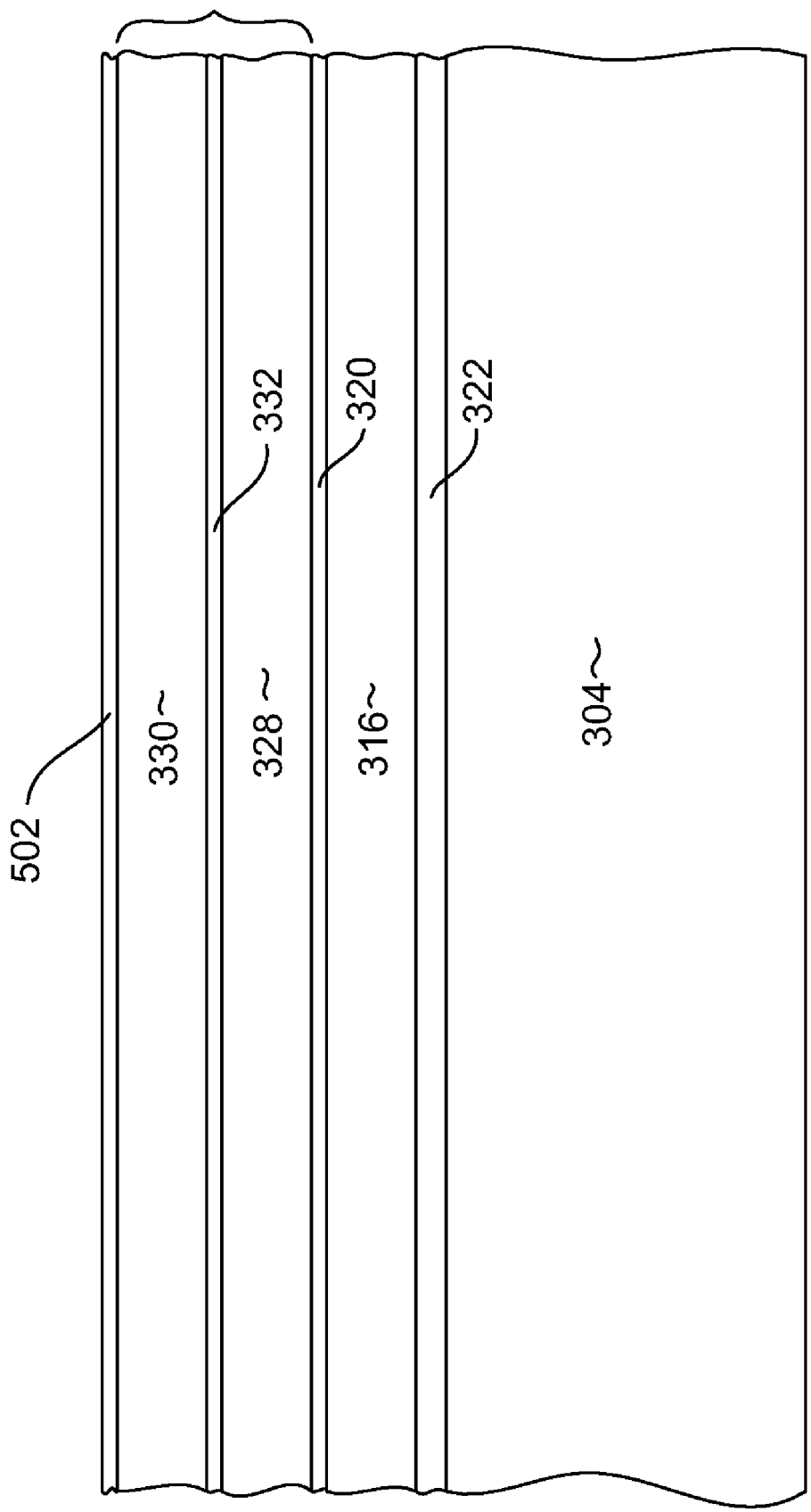

With reference to FIG. 5, a thin refill layer 502 can be deposited. The refill layer 502 can be CoFe with about 40 atomic percent Fe (like the AP1 layer 330) so that it becomes a part of the AP2 layer 330. This refill layer 502 can be deposited by sputtering or ion beam deposition, similar to the other previously deposited layers. The presence of the refill layer 502 ensures an optimal, smooth surface for promoting strong exchange coupling with a layer antiferromagnetic material as will be discussed below.

Figure 6:
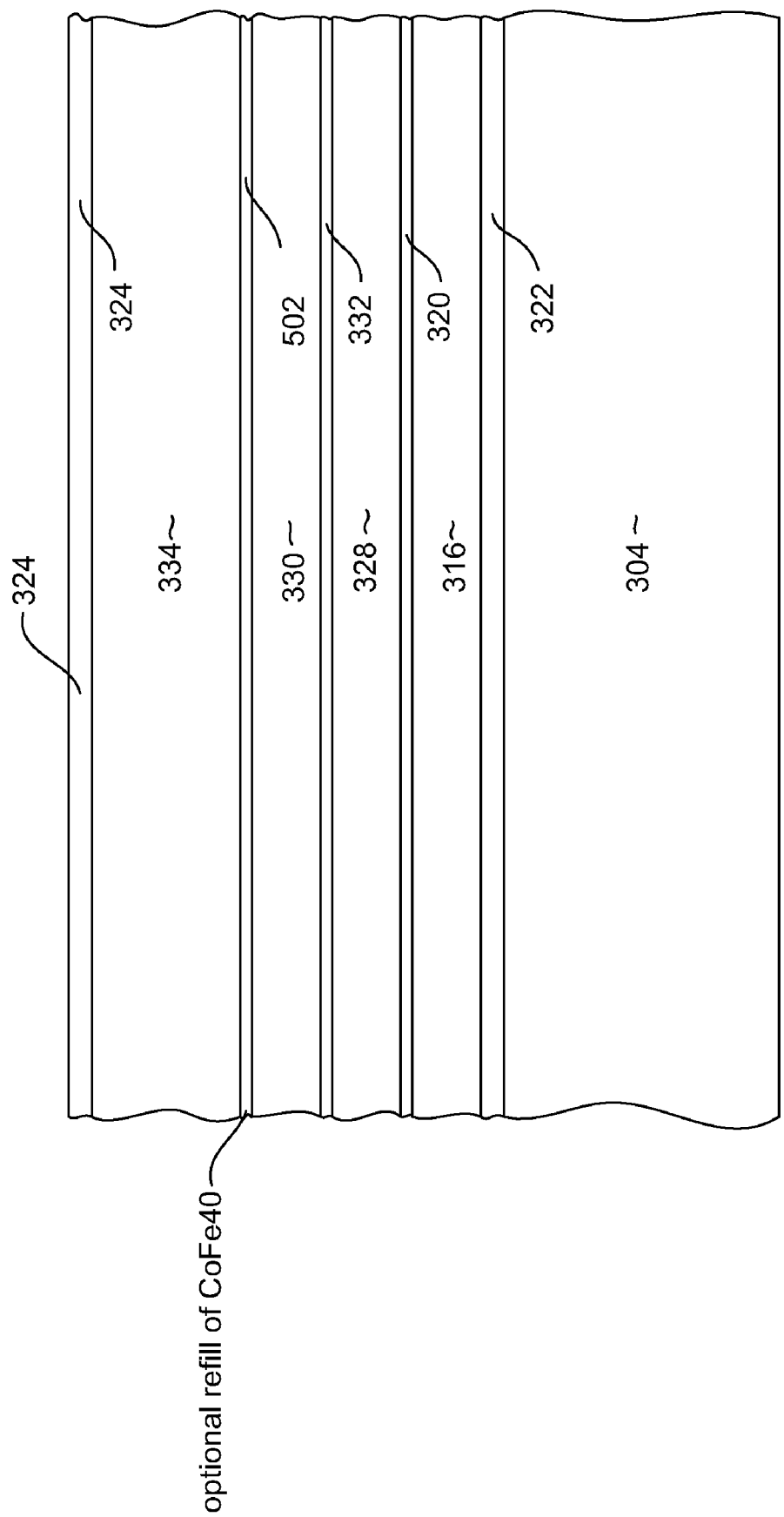

With reference to FIG. 6, a layer of antiferromagnetic material (AFM layer) 334 is deposited over the AP2 layer 330 and refill layer 502 (if present). The AFM layer 334 can be IrMn, PtMn, or some other suitable AFM material. A second capping layer 324, also preferably constructed of Ta, is deposited over the AFM material layer 334. After depositing the second capping layer 324, a second, lower temperature annealing is performed. This lower temperature annealing is performed to set the magnetizations 330, 338 of the pinned layer in the manner described above with reference to FIG. 3. This second, lower temperature annealing can be performed at a temperature of 200-300 degrees Celsius or about 240 degrees Celsius for a short duration, about 5 to 10 minutes. While this temperature is maintained, a strong magnetic field is applied (e.g. greater than 30 KOe) in a direction perpendicular to the air bearing surface of the head. This magnetic field is sufficiently strong to temporarily overcome the anti-parallel coupling between the AP1 and AP2 layers 328, 330 so that the magnetizations of both layers are temporarily oriented in the same direction perpendicular to an air bearing surface plane (e.g. transversely). This magnetic field is maintained while the temperature is reduced to room temperature. Then, after the magnetic field is removed, the magnetizations 338, 330 will be as shown in FIG. 3.

Figure 7:
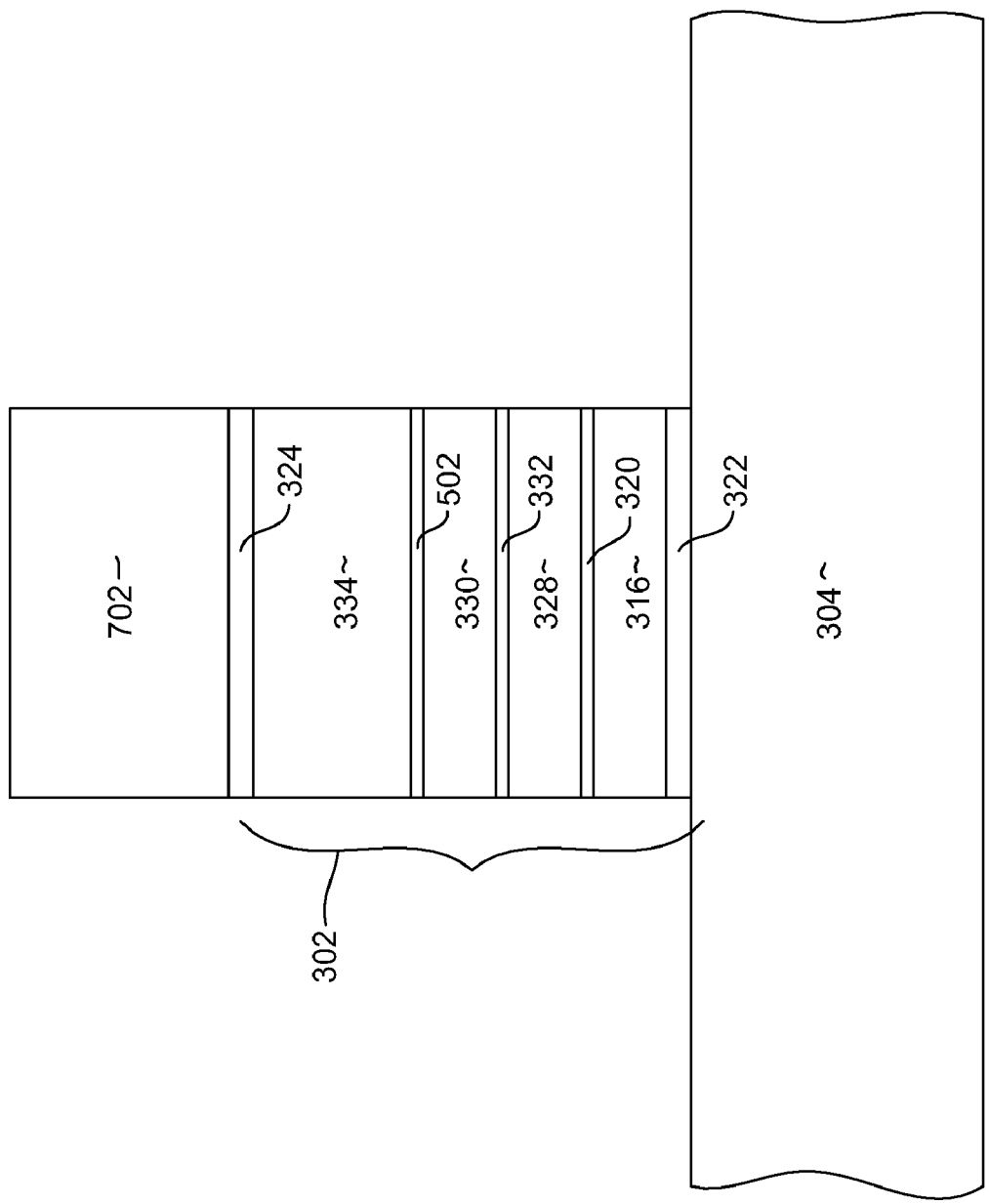

With reference now to FIG. 7, a mask structure 702 is formed over the layers 304, 322, 316, 320, 328, 332, 330, 502, 324. An ion milling is then performed to define a sensor stack 302. Two masking and milling processes will actually be performed. One masking and milling process, using a mask 702 such as that shown, will be performed to define the track width of the sensor stack. Another masking and milling process will be performed to define the stripe height of the sensor, and may be performed before or after the track-width defining masking and milling. After, the sensor stack 302 has been defined, the insulation layers 312, 314, hard bias layers 308, 310 and upper lead/shield 304 can be formed according to methods familiar to those skilled in the art.

By applying the AFM layer after the first, high temperature annealing has been performed, the TMR performance advantages of the high temperature annealing can be realized, without the negative influence of Mn migration that would occur if the AFM layer 334 were present during the high temperature annealing. The second, lower temperature annealing that is used to set the magnetization of the AP1 and AP2 layers 328, 330 is not at a high enough temperature to cause such a Mn migration into the other layers.

Figure 8:
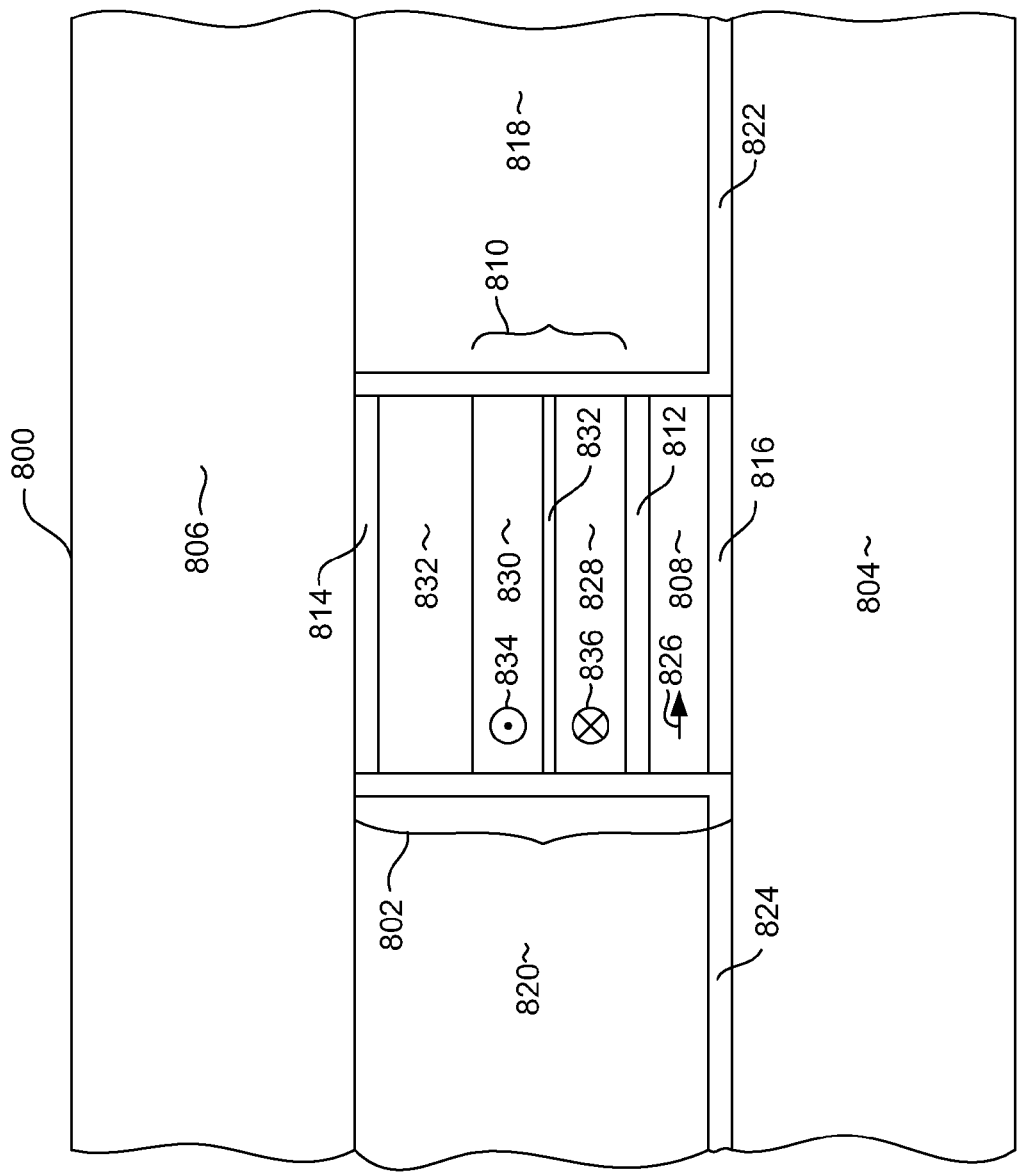
FIG. 8 is an ABS view of a magnetoresistive sensor according to an alternate embodiment of the invention.

With reference now to FIG. 8 a magnetoresistive sensor 800 according to another embodiment of the invention is described. This sensor 800 is being described in terms of a current perpendicular to plane (CPP) giant magnetoresistive (GMR) sensor, but it should be pointed out that this is by way of example only, and the sensor could also be a current in plane (CIP) giant magnetoresistive (GMR) sensor.

The sensor 800 includes a sensor stack 802 sandwiched between first and second, electrically conductive, magnetic leads 804, 806. The sensor stack 802 includes a free layer structure 808, a pinned layer structure 810 and a non-magnetic electrically conductive spacer layer 812 sandwiched between the pinned layer structure 810 and free layer structure 808. The non-magnetic, electrically conductive spacer layer can be constructed of Cu. The sensor stack 802 also includes a capping layer 814, preferably constructed of Ta, and a seed layer 816 that can be, Ta, Ru, NiFe, or a combination of CoFe and NiFe with a thin layer of Ru thereover.

The sensor 800 also may include first and second hard bias layers 818, 820, which are separated from the sensor stack 802 and lead 804 by insulation layers 822, 824. The bias layers 818, 820 provide a magnetic bias field that biases the magnetization of the free layer 808 in a desired direction parallel with the ABS as indicated by arrow 826.

Figure 11:
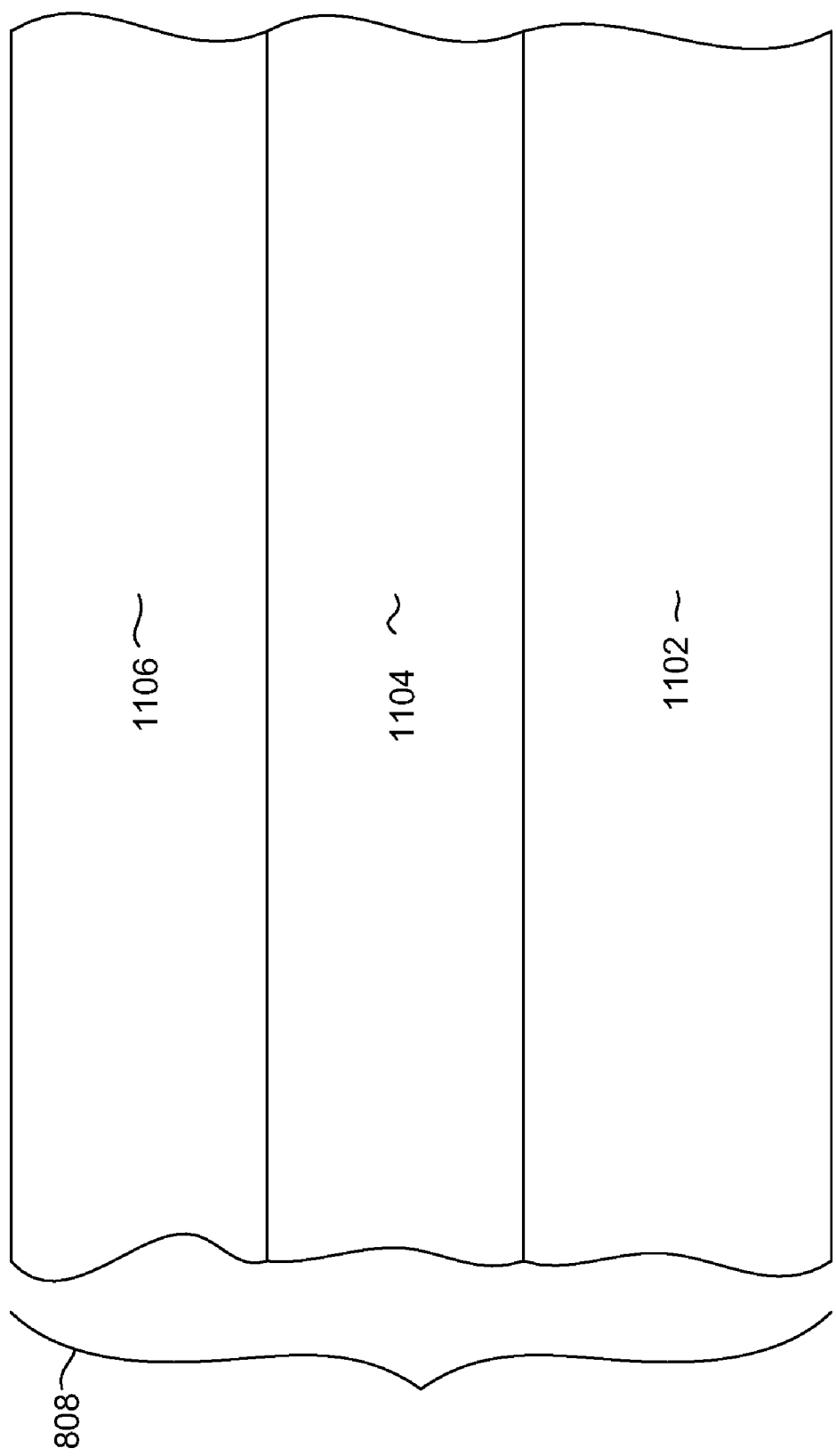
FIG. 11 is an enlarged view of a free layer structure of a magnetoresistive sensor according to an embodiment of the invention.

FIG. 11, shows an enlarged view of the free layer structure 808 according to a possible embodiment of the invention. The free layer structure 808 is preferably constructed of CoFe and a Heusler alloy such as $Co_2XZ$, where X is a material selected from the group consisting of Mn, Fe and Cr, and Z is a material selected from the group consisting of Ge, Al and Si. Most preferably the free layer 808 is constructed as first and second layers of CoFe 1102, 1106 with a layer of Huesler such as $Co_2XZ$ 1104 sandwiched between the first and second CoFe layers.

The pinned layer structure 810 includes a first magnetic layer AP1 828 and a second magnetic layer AP2 layer 830, with an antiparallel coupling layer such as Ru 832 sandwiched between the AP1 layer 828 and AP2 layer 830. The AP1 layer 828, which is the magnetic layer closest to the free layer 808, is preferably constructed of CoFe and a Huesler alloy such as $Co_2XZ$, or more preferably as first and second layers of CoFe with a layer of Huesler alloy such as $Co_2XZ$ sandwiched therebetween (similar to the free layer structure 808, described in FIG. 11). The AP2 layer 830 can be constructed of CoFe, having about 40 atomic percent Fe.

The AP2 layer 830 is exchange coupled with a layer of antiferromagnetic material (AFM layer) 832, which strongly pins the magnetization of the AP2 layer 830 in a first direction perpendicular to the ABS as indicated by arrowhead 834. Antiparallel coupling between the AP1 and AP2 layers 828, 830 pins the magnetization of the AP1 layer in a second direction opposite to the first direction, as indicated by arrow tail 836.

Figure 9:
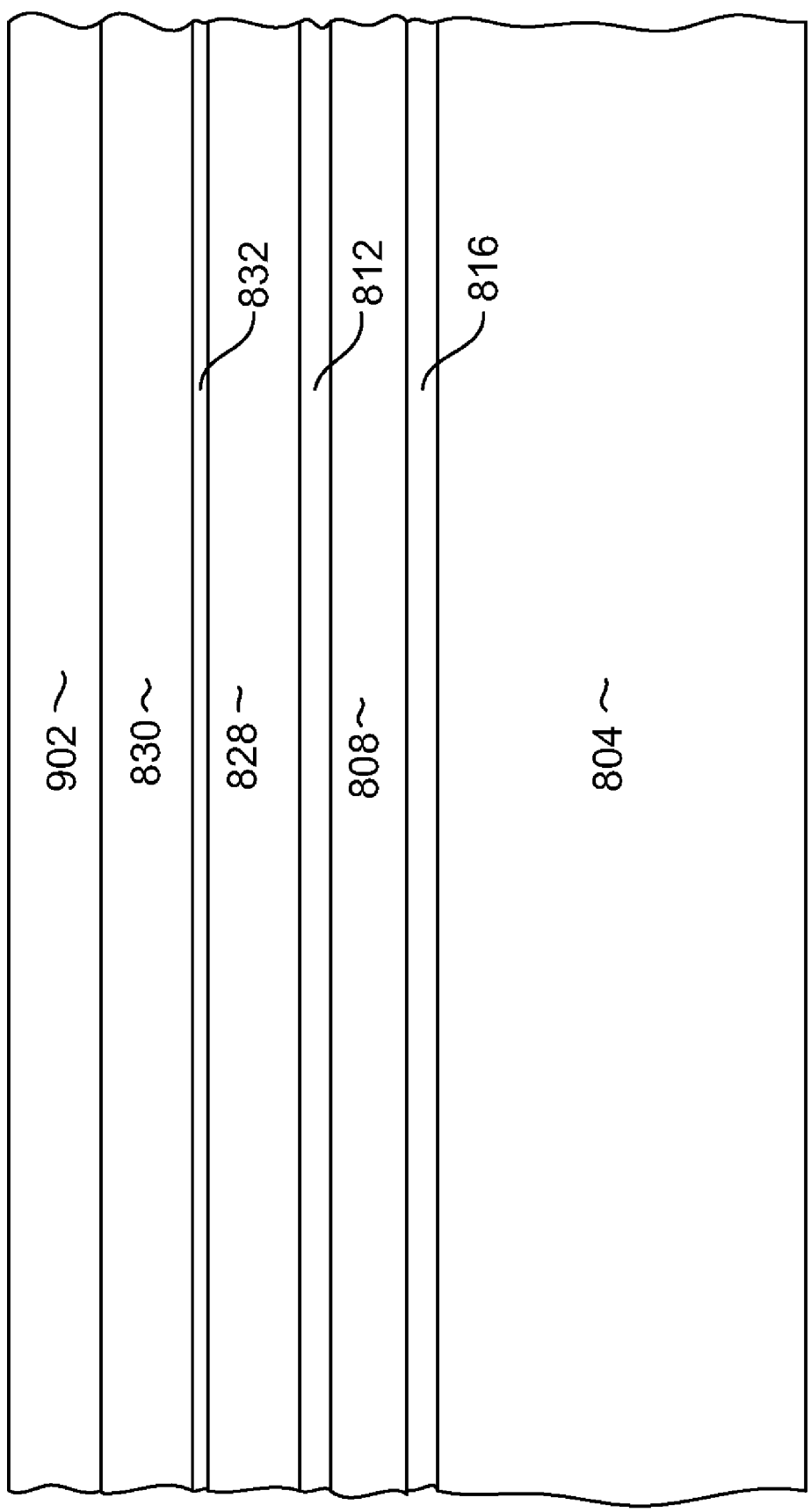
FIGS. 9-10 are views of a magnetoresistive sensor in intermediate stages of manufacture illustrating a method of manufacturing a sensor according to an embodiment of the invention.
Figure 10:
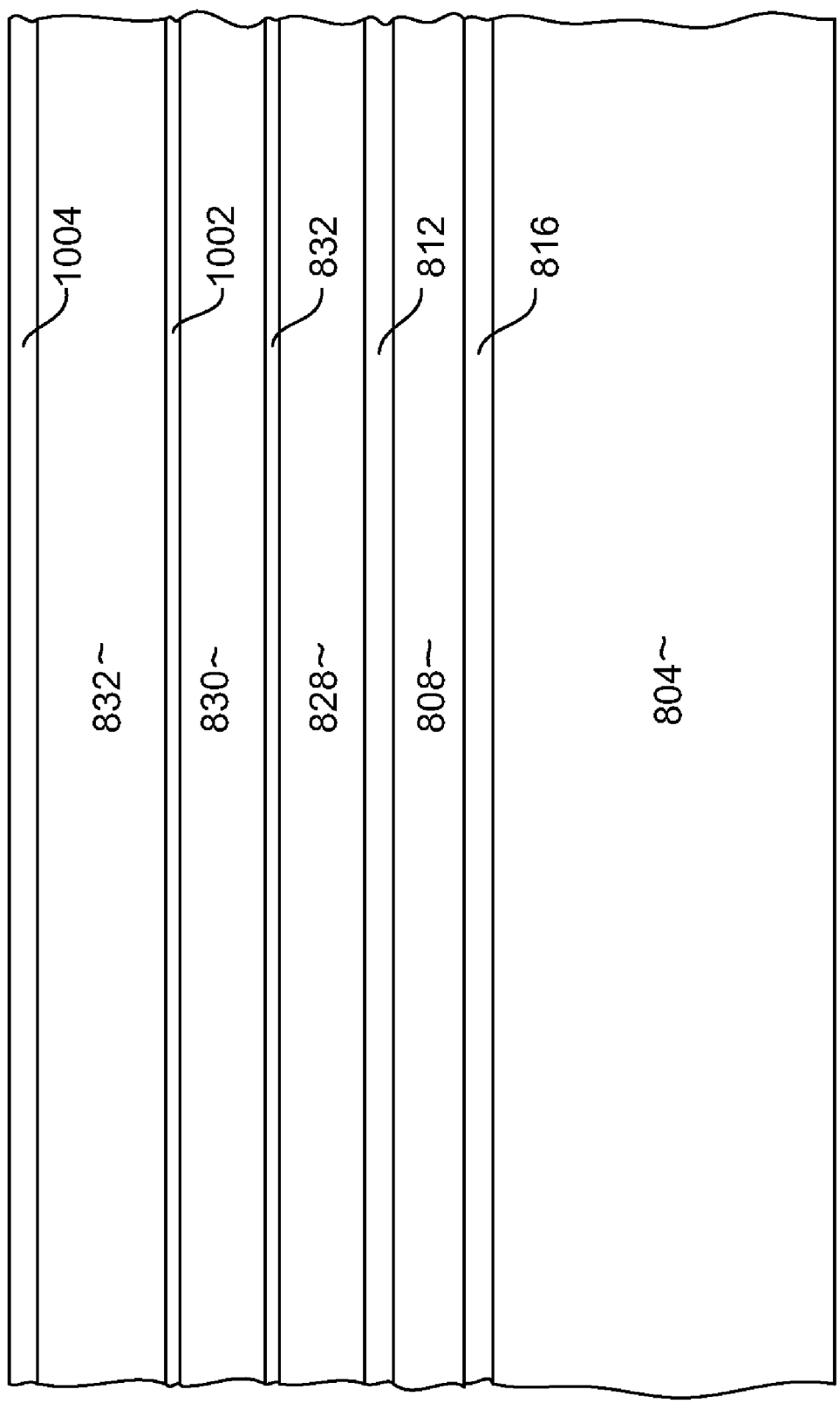

With reference now to FIGS. 9-10, a method is described for manufacturing a magnetoresistive sensor such as that described above with reference to FIG. 8. With particular reference to FIG. 9, a shield layer 804 is formed on a substrate (not shown). A seed layer 816, which may be Ta, Ru, NiFe, CoFe or a combination of these materials, is deposited over the lead layer 804. A magnetic free layer 808, is then deposited over the seed layer 816. The free layer 808 is preferably formed by depositing a first layer of CoFe, then depositing a layer of Huesler alloy such as $Co_2XZ$ over the first CoFe layer, and then depositing a second layer of CoFe over the layer of Huesler alloy. The element "X" can be a material selected from the group consisting of Mn, Fe, and Cr. The element "Z" can be a material selected from the group consisting of Ge, Al and Si. A non-magnetic, electrically insulating spacer layer 812, preferably formed of Cu, is deposited over the free layer 808. A first magnetic layer of a pinned layer structure (AP1) 828 is then deposited over the spacer layer 812. The AP1 layer 828 preferably has a structure similar to that of the free layer 808 in that it is formed by depositing a first layer of CoFe, depositing a layer of Huesler alloy such as $Co_2XZ$ over the first layer of CoFe, and depositing a layer of CoFe over the layer of Huesler alloy. Again, the element "X" can be Mn, Fe or Cr, and the element "Z" can be Ge, Al or Si.

A Ru spacer layer 832 is then deposited over the AP1 layer 828. A second magnetic layer of the pinned layer structure (AP2) 830 is then deposited. The AP2 layer 830 can be CoFe with about 40 atomic percent Fe. Finally, a first capping layer 902, preferably of Ta, is deposited over the AP2 layer 830.

After Ta capping layer 902 has been deposited, a first, high temperature annealing process is performed. The deposited layers 804, 816, 808, 812, 828, 832, 830, 902 are raised to a temperature of 300 to 400 degrees Celsius. As described above, with the regard to the previously described embodiment, this high temperature annealing causes a change in grain structure of the layers, especially the free layer 808, and AP1 layer 828 that greatly improves dR/R performance of the GMR sensor.

After the high temperature annealing has been performed, a reactive ion etching (RIE) is performed sufficiently to remove the first Ta capping layer 902, thereby exposing the AP2 layer 830. The RIE can be performed in a Fluorine chemistry, such as in an atmosphere that contains $CF_4$ or $CF_4$ and $CHF_3$. A cleaning process is then performed, such as a low power plasma treatment in 3 percent Ar/H2. Then, with reference to FIG. 10, an optional magnetic refill layer 1002 is deposited over the AP2 layer 830. The refill layer 1002 is preferably the same material as the AP2 layer 830 (e.g. CoFe with about 40 atomic percent Fe).

A layer of antiferromagnetic material (AFM) 832 is then deposited over the refill layer 1002 (or over the AP2 layer 830 if no refill is provided). The AFM layer 832 can be, for example, PtMn or IrMn. A second capping layer 1004 is then deposited over the AFM layer 832. After the capping layer 1004 has been deposited, a second annealing (a lower temperature annealing) can be performed at a temperature of 200-300 degrees Celsius or about 240 degrees Celsius to set the magnetizations of the pinned layers 828, 830.

Further manufacturing of the sensor (not shown) can include masking and ion milling processes to define the sensor width and stripe height of the sensor, as well as refilling with hard bias and lead layers and the formation of an upper shield/lead.

The above described process allows the first, high temperature annealing to be performed to improve the grain structure and GMR performance of the sensor without the AFM being present. As described above, this advantageously avoids a migration of Mn from the AFM layer into the magnetic layers of the sensor during the high temperature annealing, which would otherwise degrade sensor performance.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a tunnel junction magnetoresistive sensor, comprising:
    depositing a series of sensor layers including at least one magnetic layer comprising cobalt-iron-boron (CoFeB), and a first capping layer formed at the top of the series of sensor layers;
    performing a first annealing,
    removing the first capping layer;
    depositing a layer of antiferromagnetic material;
    depositing a second capping layer; and
    performing a second annealing, the second annealing being performed a lower temperature than the first annealing.

2. A method as in claim 1, wherein the first annealing is performed at a temperature of between 300 and 400 degrees Celsius and the second annealing is performed at a temperature of 200 to 300 degrees Celsius.

3. A method as in claim 1, further comprising, after removing the first capping layer, performing a cleaning operation.

4. A method as in claim 1, further comprising, after removing the first capping layer, performing a low power plasma treatment in an atmosphere containing Ar and $H_2$.

5. A method as in claim 1, further comprising, after removing the first capping layer, performing a cleaning operation, and then depositing a magnetic refill layer.

6. A method as in claim 1, further comprising, after removing the first capping layer, performing a low power plasma treatment in an atmosphere containing Ar and $H_2$, and then depositing a CoFe refill layer.

7. A method as in claim 1, wherein the first and second capping layers each comprise Ta.

8. A method as in claim 1, wherein the series of sensor layers further comprises:
   a magnetic free layer comprising CoFeB;
   a non-magnetic, electrically insulating barrier layer deposited over the magnetic free layer; and
   a pinned layer structure comprising a layer of CoFeB deposited over the non-magnetic, electrically insulating harrier layer.

9. A method as in claim 1, wherein the series of sensor layers further comprises:
   a magnetic free layer comprising CoFeB;
   a non-magnetic, electrically insulating barrier layer deposited over the magnetic free layer;
   a first magnetic pinned layer comprising CoFeB deposited over the non-magnetic, electrically insulating barrier layer;
   a Ru antiparallel coupling layer deposited over the first magnetic pinned layer; and
   a second magnetic pinned layer comprising CoFe deposited over the Ru antiparallel coupling layer.

10. A method as in claim 9 wherein the second pinned layer has about 40 atomic percent Fe.

11. A method as in claim 1, wherein the series of sensor layers further comprises:
    a magnetic free layer comprising CoFeB;
    a non-magnetic, electrically insulating barrier layer deposited over the magnetic free layer;
    a first magnetic pinned layer comprising CoFeB deposited over the non-magnetic, electrically insulating barrier layer;
    a Ru antiparallel coupling layer deposited over the first magnetic pinned layer; and
    a second magnetic pinned layer comprising CoFe with about 40 atomic percent Fe deposited over the Ru antiparallel coupling layer, the first capping layer being deposited over the second magnetic pinned layer; the method further comprising, after removing the first capping layer:
    performing a low power plasma treatment to clean the second magnetic pinned layer; and
    depositing a CoFe refill layer on the cleaned surface of the second pinned layer,
    the CoFe refill layer having about 40 atomic percent Fe.

* * * * *

UNITED STATES PATENT AND TRADEMARK OFFICE
CERTIFICATE OF CORRECTION

PATENT NO. : 7,820,455 B2
APPLICATION NO. : 12/060006
DATED : October 26, 2010
INVENTOR(S) : Hardayal Singh Gill It is certified that error appears in the above-identified patent and that said Letters Patent is hereby corrected as shown below:

In the claims:

Column 9, Line 17, change "harrier" to --barrier--;

Signed and Sealed this
Twenty-first Day of May, 2013

Teresa Stanek Rea
*Acting Director of the United States Patent and Trademark Office*